(12) United States Patent
Lin et al.

(10) Patent No.: US 11,798,809 B2
(45) Date of Patent: Oct. 24, 2023

(54) SEMICONDUCTOR DEVICE AND METHOD OF MANUFACTURING

(71) Applicant: Taiwan Semiconductor Manufacturing Co., Ltd., Hsinchu (TW)

(72) Inventors: Meng-Han Lin, Hsinchu (TW); Sai-Hooi Yeong, Zhubei (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/397,632

(22) Filed: Aug. 9, 2021

(65) Prior Publication Data

US 2022/0406606 A1   Dec. 22, 2022

Related U.S. Application Data

(60) Provisional application No. 63/211,750, filed on Jun. 17, 2021.

(51) Int. Cl.
*H01L 21/28* (2006.01)
*H01L 27/088* (2006.01)
*H01L 21/8234* (2006.01)
*H01L 29/423* (2006.01)

(52) U.S. Cl.
CPC ........... *H01L 21/28185* (2013.01); *H01L 21/823456* (2013.01); *H01L 21/823462* (2013.01); *H01L 27/088* (2013.01); *H01L 29/42376* (2013.01)

(58) Field of Classification Search
CPC . H01L 21/28; H01L 21/3115; H01L 21/8234; H01L 21/28185; H01L 21/823456; H01L 21/823462; H01L 21/31155; H01L 27/088; H01L 29/51; H01L 29/66; H01L 29/78; H01L 29/423; H01L 29/42376; H01L 21/8238; H01L 21/823857; H01L 29/513; H01L 29/665; H01L 29/66545
USPC .................................................. 438/284, 286
See application file for complete search history.

(56) References Cited

U.S. PATENT DOCUMENTS

| | | |
|---|---|---|
| 3,933,530 A | 1/1976 | Mueller et al. |
| 2004/0067619 A1 | 4/2004 | Niimi et al. |
| 2004/0102010 A1* | 5/2004 | Khamankar ...... H01L 21/28185 257/E21.268 |
| 2008/0203477 A1* | 8/2008 | Yamazaki ............ H01L 27/105 257/E29.302 |

(Continued)

FOREIGN PATENT DOCUMENTS

| | | |
|---|---|---|
| DE | 102018124855 A1 | 5/2019 |
| JP | 2012094656 A | 5/2012 |

(Continued)

*Primary Examiner* — Chuong A Luu
(74) *Attorney, Agent, or Firm* — Slater Matsil, LLP

(57) ABSTRACT

Semiconductor devices and methods of manufacturing are presented wherein a gate dielectric is treated within an analog region of a semiconductor substrate. The gate dielectric may be treated with a plasma exposure and/or an annealing process in order to form a recovered region of the gate dielectric. A separate gate dielectric is formed within a logic region of the semiconductor substrate, and a first gate electrode and second gate electrode are formed over the gate dielectrics.

20 Claims, 14 Drawing Sheets

(56) References Cited

U.S. PATENT DOCUMENTS

| | | |
|---|---|---|
| 2010/0044755 A1 | 2/2010 | Tsuda et al. |
| 2011/0014773 A1* | 1/2011 | Lin .................... H01L 29/4966 |
| | | 257/E21.546 |
| 2016/0056233 A1 | 2/2016 | Mitsuiki et al. |
| 2016/0079353 A1 | 3/2016 | Chen et al. |
| 2016/0322384 A1* | 11/2016 | Zang ................... H01L 29/0847 |
| 2016/0343823 A1 | 11/2016 | Akram et al. |
| 2019/0088756 A1* | 3/2019 | Fang ............... H01L 21/823842 |
| 2019/0131401 A1 | 5/2019 | Lo et al. |

FOREIGN PATENT DOCUMENTS

| | | |
|---|---|---|
| TW | 201017453 A | 5/2010 |
| TW | 201611283 A | 3/2016 |
| TW | 201919231 A | 5/2019 |

\* cited by examiner

SEMICONDUCTOR DEVICE AND METHOD OF MANUFACTURING

PRIORITY CLAIM AND CROSS-REFERENCE

This application claims the benefit of U.S. Provisional Application No. 63/211,750, filed on Jun. 17, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum feature size has been reduced, additional issues arise which should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
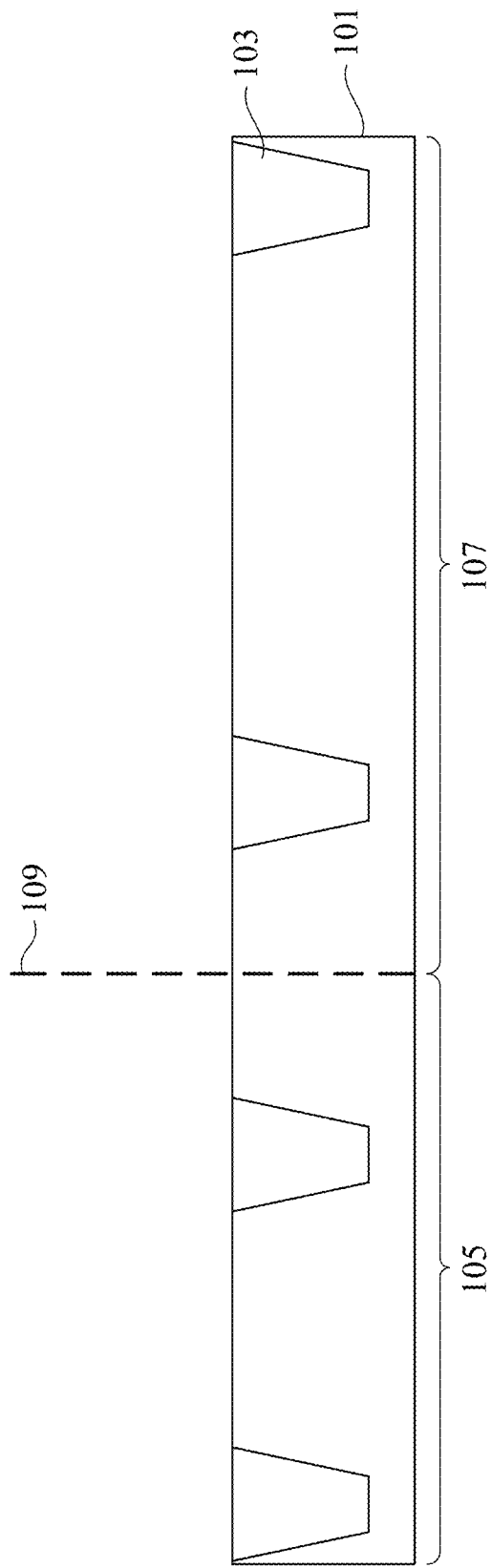
FIG. 1 illustrates a logic region and an analog region of a substrate, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to a particular embodiment in which flicker noise is reduced within analog devices (e.g., in a digital to analog device for a LCD panel) through treatment of a gate dielectric. The embodiments described, however, are not intended to limit the ideas presented, and the ideas may be implemented in a wide variety of other embodiments. All such embodiments are fully intended to be included within the scope of the disclosure.

With reference now to FIG. 1, there is illustrated a substrate 101 with shallow trench isolations (STIs) 103 formed therein. The substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

Additionally, the substrate 101 may have a logic region 105 and an analog region 107. Devices that are subsequently formed in the logic region 105 will be used to create logic devices while devices that are subsequently formed in the analog region 107 will be used to create analog devices. In some embodiments the logic region 105 may be located immediately adjacent to the analog region 107, while in other embodiments the logic region 105 may be located away from the analog region 107 (represented in FIG. 1 by the dashed line labeled 109).

The STIs 103 may be formed by etching the substrate 101 to form a trench and filling the trench with a dielectric material as is known in the art. For example, the STIs 103 may be filled with a dielectric material such as an oxide material, a high-density plasma (HDP) oxide, or the like. However, any suitable material and any suitable method of deposition may be utilized.

Figure 2:
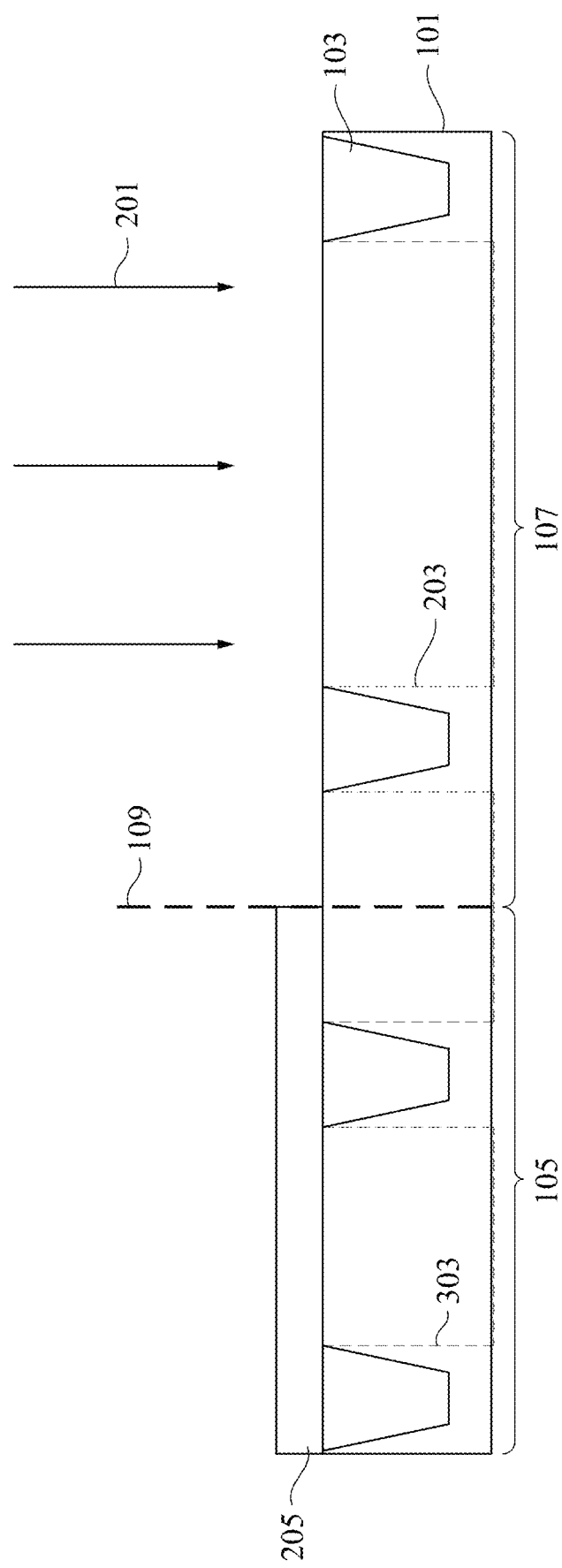
FIG. 2 illustrates formation of a first well, in accordance with some embodiments.

FIG. 2 illustrates formation of a first well 203 in the analog region 107. To initiate the creation of the first well 203 within the analog region 107, the logic region 105 is first protected. In an embodiment the logic region 105 may be protected by placing a first photoresist 205 over the substrate 101, and imaging the photoresist to create a difference between exposed regions and non-exposed regions. Once imaged, the first photoresist 205 is developed to remove portions of the first photoresist 205 over the analog region 107 and leaving portions of the first photoresist 205 over the logic region 105 to protect the logic region 105.

Once the logic region 105 has been protected, the first well 203 may be created within the analog region 107 by placing first dopants into the substrate 101. The first dopants may be dopants that are suitable for the type of device to be manufactured. For example, in an embodiment in which devices to be formed are n-type devices, the first dopants may be p-type dopants such as boron, aluminum, gallium, indium, combinations of these, or the like. In other embodiments in which devices to be formed are p-type devices, the first dopants may be n-type dopants such as phosphorous, arsenic, antimony, combinations of these, or the like. However, any suitable dopants may be utilized.

In an embodiment the first dopants may be placed into the substrate 101 using, e.g., a first implantation process (represented in FIG. 2 by the arrows labeled 201). In this embodiment ions of the first dopants are formed and then accelerated towards the top surface of the substrate 101, thereby implanting the ions of the first dopants into the substrate 101. However, any suitable method for implanting the first dopants, may be utilized.

Once the first dopants have been implanted into the substrate 101 to form the first well 203, the first photoresist 205 is removed. In an embodiment the first photoresist 205 may be removed using an ashing process, in which a temperature of the first photoresist 205 is raised until the first photoresist 205 undergoes a thermal decomposition and may be easily removed. However, any suitable method or combination of methods, such as wet etching, may also be utilized.

Figure 3:
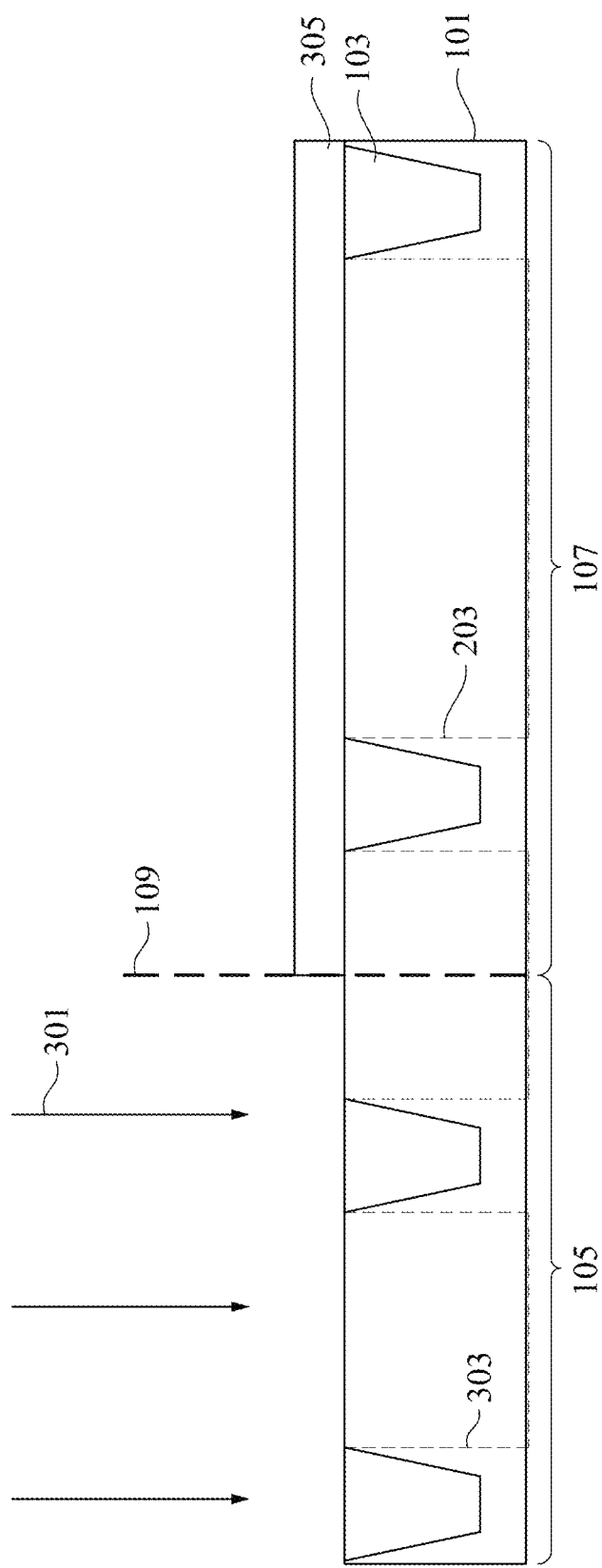
FIG. 3 illustrates formation of a second well, in accordance with some embodiments.

FIG. 3 illustrates that, once the first well 203 has been formed in the analog region 107, a second well 303 is formed in the logic region 105. To initiate the creation of the second well 303 within the logic region 105, the analog region 107 is first protected. In an embodiment the analog region 107 may be protected by placing a second photoresist 305 over the substrate 101, and imaging the second photoresist 305 to create a difference between exposed regions and non-exposed regions. Once exposed, the second photoresist 305 is developed to remove portions of the second photoresist 305 over the logic region 105 and leaving portions of the second photoresist 305 over the analog region 107, thereby protecting the analog region 107.

Once the analog region 107 has been protected, the second well 303 may be created within the logic region 105 by placing second dopants into the substrate 101. The second dopants may be dopants that are suitable for the type of device to be manufactured. For example, in an embodiment in which devices to be formed are n-type devices, the second dopants may be p-type dopants such as boron, aluminum, gallium, indium, combinations of these, or the like. In other embodiments in which devices to be formed are p-type devices, the second dopants may be n-type dopants such as phosphorous, arsenic, antimony, combinations of these, or the like. However, any suitable dopants may be utilized.

Additionally, any suitable combination of devices between the logic region 105 and the analog region 107 may be used. For example, if the devices formed within the logic region 105 are n-type devices, the devices formed within the analog region 107 may be either n-type devices or p-type devices. Also, if the devices formed within the logic region 105 are p-type devices, the devices formed within the analog region 107 may be either n-type devices or p-type devices. Any suitable combination of devices may be utilized.

In an embodiment the second dopants may be placed into the substrate 101 using, e.g., a second implantation process (represented in FIG. 3 by the arrows labeled 301). In this embodiment ions of the second dopants are formed and then accelerated towards the top surface of the substrate 101, thereby implanting the ions of the second dopants into the substrate 101. In an embodiment the second dopants in the logic region 105 are implanted to have a higher concentration than the first dopants implanted in the analog region 107. For example, the first dopants may have a first concentration within the first well 203 of between about $1.0 \times 10^{14}$ cm$^{-3}$ and about $1.0 \times 10^{18}$ cm$^{-3}$, while the second dopants may have a second concentration within the second well 303 greater than the first concentration of between about $1.0 \times 10^{14}$ cm$^{-3}$ and about $1.0 \times 10^{18}$ cm$^{-3}$. However, any suitable method for implanting the second dopants, and any suitable concentration of first dopants and second dopants, may be utilized.

Once the second dopants have been implanted into the substrate 101 to form the second well 303, the second photoresist 305 is removed. In an embodiment the second photoresist 305 may be removed using an ashing process, in which a temperature of the second photoresist 305 is raised until the second photoresist 305 undergoes a thermal decomposition and may be easily removed. However, any suitable method or combination of methods, such as wet etching, may also be utilized.

Figure 4:
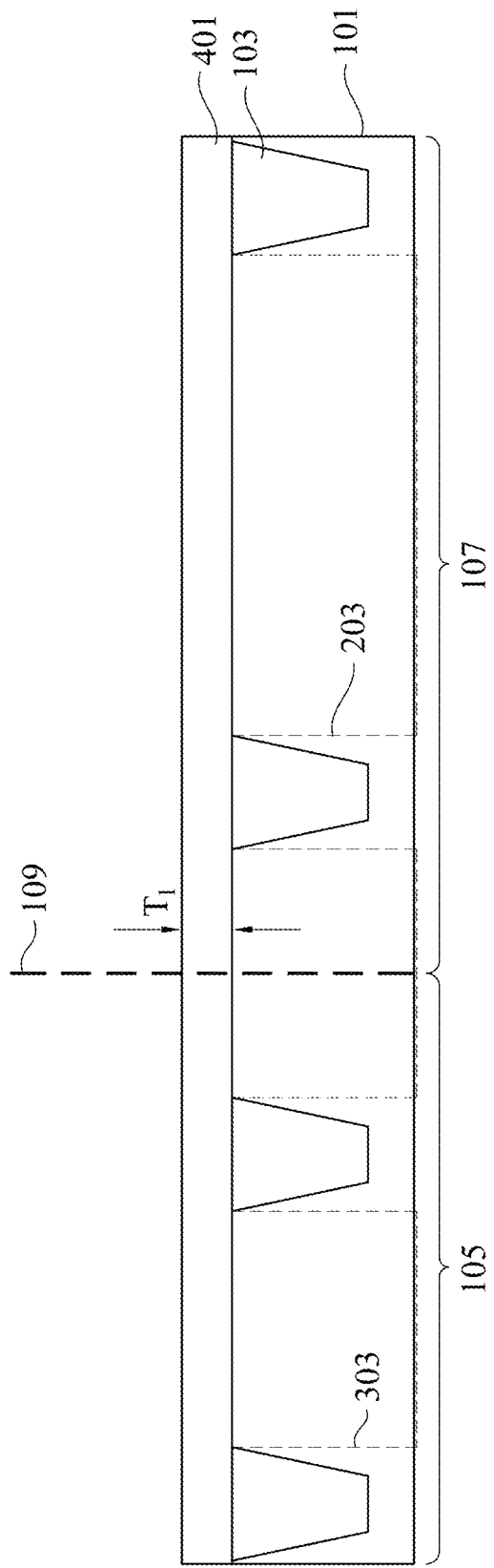
FIG. 4 illustrates formation of a first dielectric layer, in accordance with some embodiments.

FIG. 4 illustrates deposition of a first dielectric layer 401 over the substrate 101 to begin formation of a gate dielectric for devices within the analog region 107. The first dielectric layer 401 may be a high-K dielectric material, such as silicon oxide, silicon oxynitride, silicon nitride, an oxide, a nitrogen-containing oxide, aluminum oxide, lanthanum oxide, hafnium oxide, zirconium oxide, hafnium oxynitride, a combination thereof, or the like. The first dielectric layer 401 may have a relative permittivity value greater than about 4.

In an embodiment in which the first dielectric layer 401 comprises an oxide layer, the first dielectric layer 401 may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. In one embodiment, the first dielectric layer 401 may have a first thickness $T_1$ of between about 10 Å to about 150 Å in thickness, such as 100 Å in thickness.

In other embodiments in which the first dielectric layer 401 is a metal oxide, such as hafnium oxide, the first dielectric layer 401 may be deposited using a deposition process. For example, the first dielectric layer 401 may be deposited using an atomic layer deposition process, a chemical vapor deposition process, a physical vapor deposition process, combinations of these, or the like. However, any suitable method of deposition may be utilized.

Figure 5:
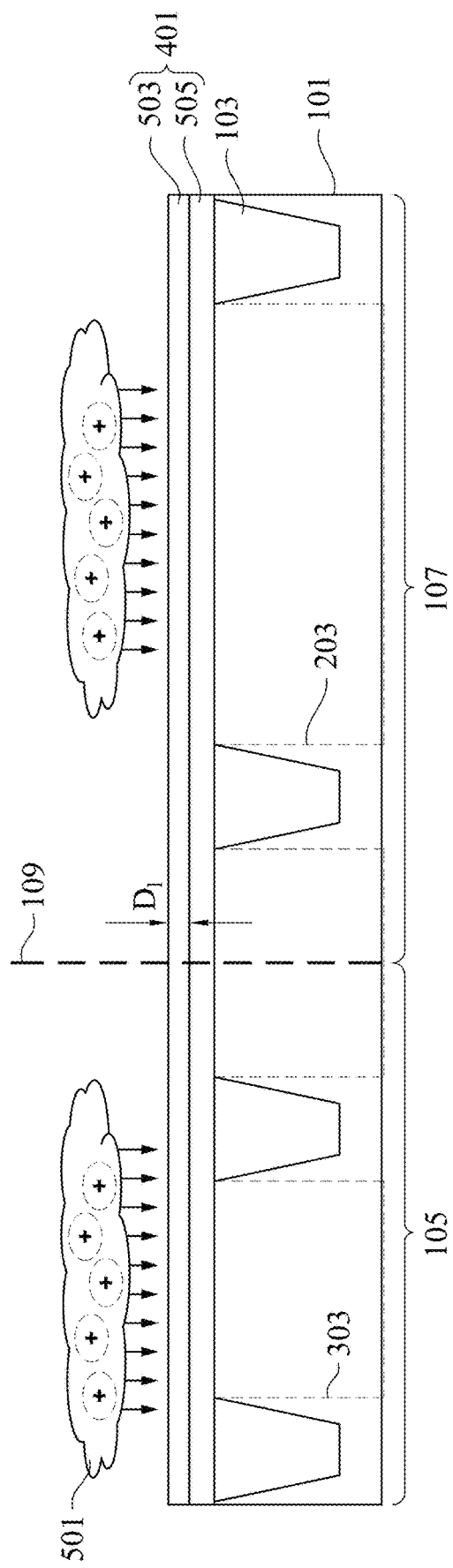
FIG. 5 illustrates a first treatment of the first dielectric layer, in accordance with some embodiments.

FIG. 5 illustrates that, once the first dielectric layer 401 is deposited, the first dielectric layer 401 is treated. In an embodiment the treatment may be a plasma treatment (represented in FIG. 5 by the cloud labeled 501) whereby the first dielectric layer 401 is exposed to a plasma of one or more plasma precursors that will help to reduce flicker noise within the devices formed within the analog region 107. In particular embodiments, the plasma precursors may be precursors such as oxygen, nitrogen, flourine, chlorine, combinations of these, or the like, although any suitable precursors may be used.

To initiate the plasma treatment 501, a flow rate of the plasma precursors can be set to be in a range from about 10 sccm to about 100 sccm, and a pressure of the plasma treatment 501 can be in a range from about 10 mTorr to about 10 Torr. The temperature of the plasma treatment 501 can be set to be in a range from about 400° C. to about 800° C. A power of the plasma generator of the plasma treatment 501 can be in a range from about 5 W to about 500 W, and a frequency of the plasma generator can be about 13.56 MHz or greater. The substrate 101 during the plasma treatment 501 can be biased in a range from about 0.5 V to about 500 V. However, any suitable process parameters may be utilized.

During the plasma treatment 501, the species of the plasma can damage the exposed surfaces and can also diffuse into the exposed surfaces of the first dielectric layer 401 to form a treated region 503 within the first dielectric layer 401, while an untreated region 505 of the first dielectric layer 401 remains between the treated region 503 and the substrate 101. For example, the species used for the plasma (e.g., oxygen, nitrogen, flourine, chlorine, . . . etc.) can be diffused into the materials that form the first dielectric layer 401 to a first depth $D_1$ from the treated surface equal to or less than about 100 nm, such as less than or equal to 5 nm. In some particular embodiments, for example when noise is desired to be better controlled, the first depth may be between about 1/10 and 1/2 of the first thickness $T_1$. Finally, the species may be diffused to a concentration in a range from about $1.0 \times 10^{10}$ cm$^{-3}$ to about $1.0 \times 10^{15}$ cm$^{-3}$. The concentration of the species can decrease from a peak proximate to the respective treated surfaces to a depth in the material.

Figure 6:
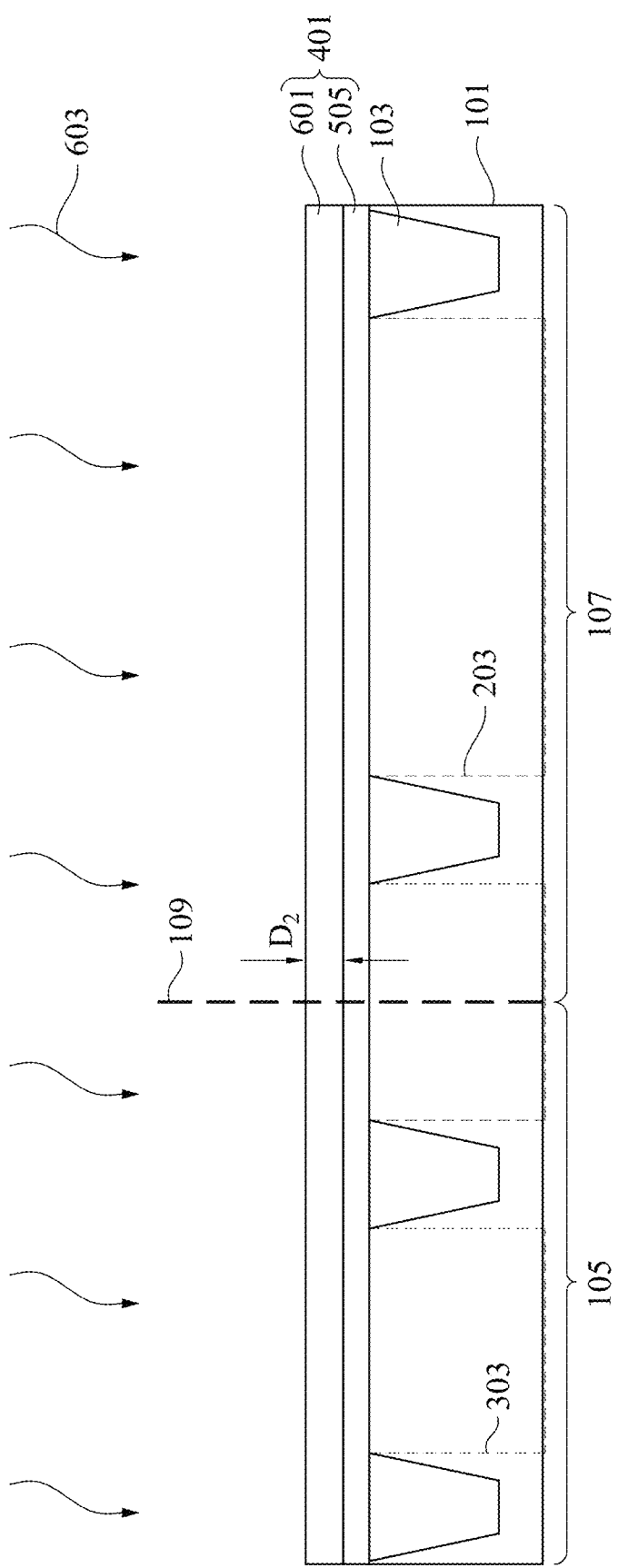
FIG. 6 illustrates an annealing process, in accordance with some embodiments.

FIG. 6 illustrates that, once the treated region 503 has been formed, the treated region 503 may be further treated in order to densify the treated region 503 and recover fixed oxide charges and traps, such that the treated region 503 has a different density than a remainder of the first dielectric layer 401. In an embodiment the treated region 503 may be treated using, e.g., an annealing process (represented in FIG. 6 by the wavy lines labeled 603) which will create a recovered region 601 from the treated region 503 (see FIG. 5). However, any suitable process may be utilized.

In a particular embodiment the annealing process 603 may be a thermal anneal that is performed in an ambient environment including oxygen ($O_2$), nitrogen ($N_2$), $N_2O$, ammonia ($NH_3$), combinations of these, or the like. Additionally, the thermal anneal may be performed at a temperature of between about 500° C. and about 1000° C. for a time of between about 10 s and about 1 hr, although any suitable temperature and time may be utilized. Additionally, while a thermal anneal has been described, any suitable annealing process, such as a milli-second laser anneal, a flash anneal, a spike anneal, or a soak anneal, may be utilized.

After the treated region 503 has been formed and then recovered to become the recovered region 601, the recovered region 601 may have a second depth $D_2$ extending from the surface of the first dielectric layer 401. In an embodiment the second depth $D_2$ may be between about 5% and about 30% of the original first thickness $T_1$ of the first dielectric layer 401. For example, if the first dielectric layer 401 was originally deposited as 100 nm thick, the recovered region may be between 5 nm and about 30 nm. If the second depth $D_2$ is too thin, the flicker noise of the analog device formed will not be improved, while if the second depth $D_2$ is too thick, the plasma energy during the plasma treatment 501 will damage too much of the first dielectric layer 401, thereby damaging the overall quality of subsequently formed gate dielectrics.

Additionally, while embodiments are described above wherein both the plasma treatment 501 and the annealing process 603 are utilized to form the recovered region 601, this is intended to be illustrative and is not intended to be limiting upon the embodiments. Rather, any suitable combination of processes, such as using the annealing process 603 by itself, may also be utilized. All such embodiments are fully intended to be included within the scope of the embodiments.

Figure 7:
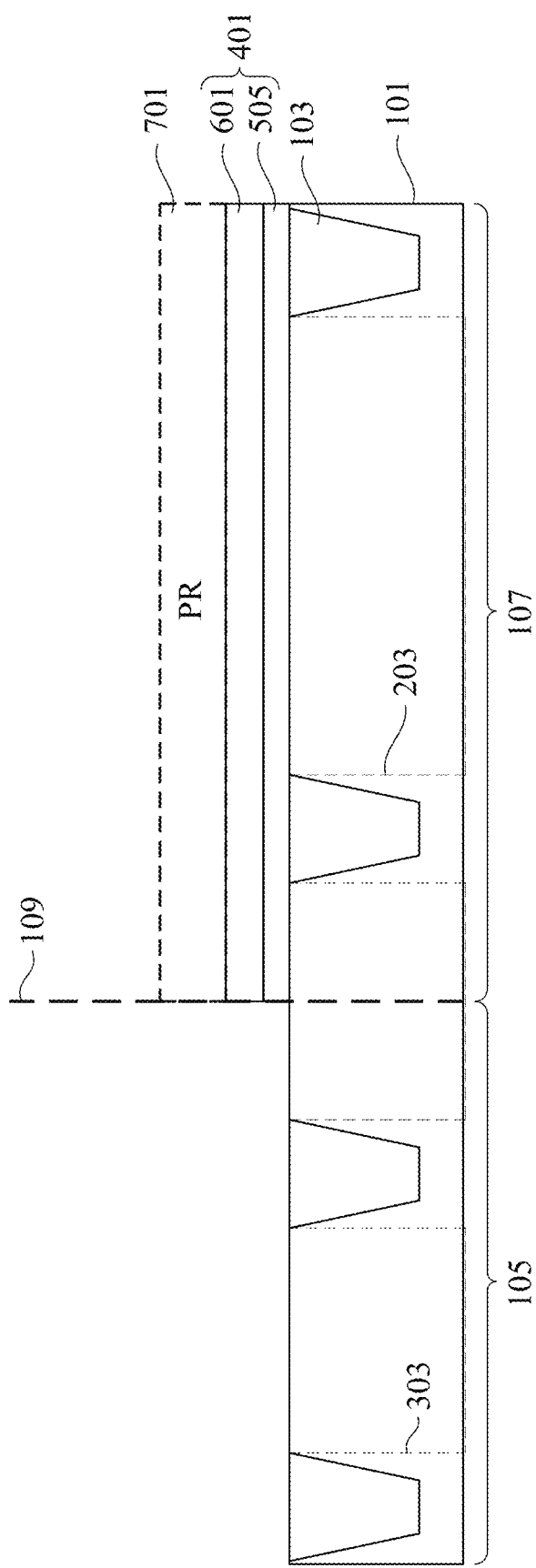
FIG. 7 illustrates removal of the first dielectric layer from the logic region, in accordance with some embodiments.

FIG. 7 illustrates that, once the recovered region 601 has been formed within the first dielectric layer 401, the first dielectric layer 401 is patterned to remove the first dielectric layer 401 from the logic region 105. In an embodiment the patterning of the first dielectric layer 401 may be initiated by placing a third photoresist 701 over the substrate 101 and imaging the third photoresist 701 to create a difference between exposed regions and non-exposed regions. Once imaged, the third photoresist 701 is developed to remove portions of the third photoresist 701 over the logic region 105 and leaving portions of the third photoresist 701 over the analog region 107.

Once the third photoresist 701 has been placed and patterned, those portions of the first dielectric layer 401 (including the recovered region 601) that are located within the logic region 105 are removed. In an embodiment the first dielectric layer 401 may be removed using, e.g., an anisotropic etching process, such as a reactive ion etching process. However, any suitable removal process may be utilized.

Additionally, once the first dielectric layer 401 has been removed from the logic region 105, the third photoresist 701 is removed. In an embodiment the third photoresist 701 may be removed using, e.g., an ashing process, whereby a temperature of the third photoresist 701 is increased until the third photoresist 701 undergoes a thermal decomposition, whereupon the third photoresist 701 may be easily removed. However, any suitable process may be utilized to remove the third photoresist 701.

Figure 8:
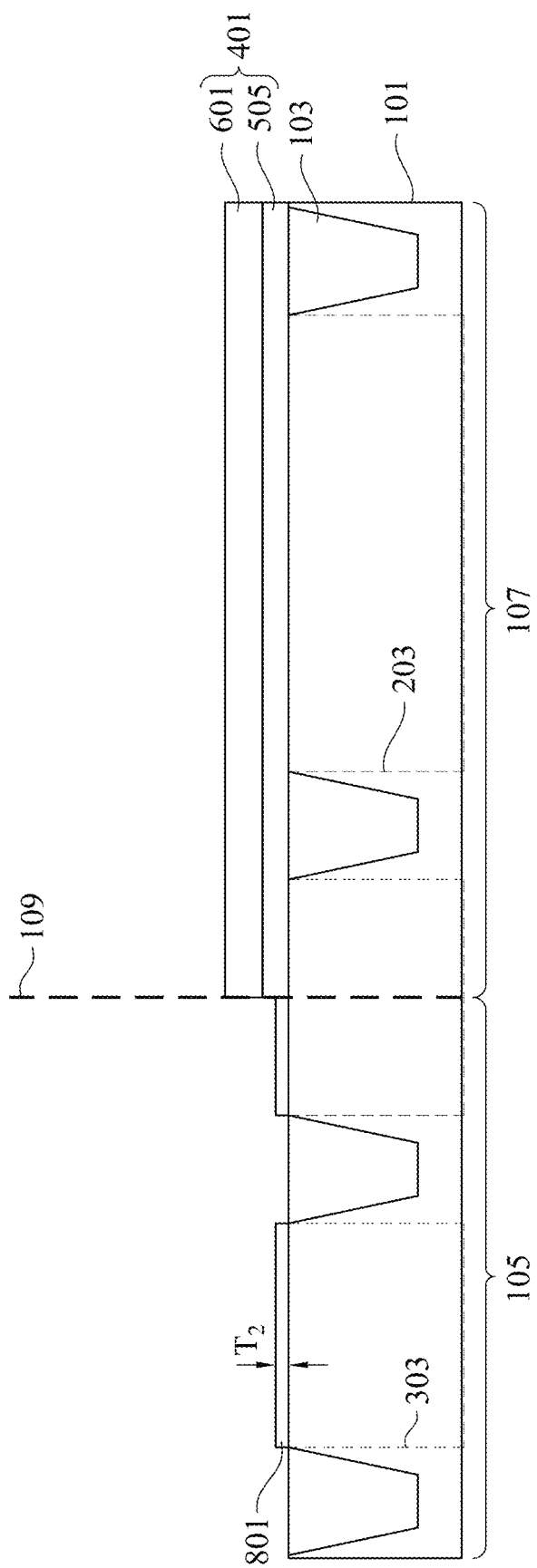
FIG. 8 illustrates formation of a second dielectric layer within the logic region, in accordance with some embodiments.

FIG. 8 illustrates formation of a second dielectric layer 801 over the logic region 105. The second dielectric layer 801 may be a high-K dielectric material, such as silicon oxide, silicon oxynitride, silicon nitride, an oxide, a nitrogen-containing oxide, aluminum oxide, lanthanum oxide, hafnium oxide, zirconium oxide, hafnium oxynitride, a combination thereof, or the like. The second dielectric layer 801 may have a relative permittivity value greater than about 4.

In an embodiment in which the second dielectric layer 801 comprises an oxide layer, the second dielectric layer 801 may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. In one embodiment, the second dielectric layer 801 may have a second thickness T$_2$ of between about 10 Å to about 150 Å in thickness, such as 100 Å in thickness.

In other embodiments in which the second dielectric layer 801 is a metal oxide, such as hafnium oxide, the second dielectric layer 801 may be deposited using a deposition process. For example, the second dielectric layer 801 may be deposited using an atomic layer deposition process, a chemical vapor deposition process, a physical vapor deposition process, combinations of these, or the like. However, any suitable method of deposition may be utilized.

Additionally, because the second dielectric layer 801 is not present during the treatment process 501 or the subsequent annealing process 603, the second dielectric layer 801 is not affected by these processes. As such, the second dielectric layer 801 remains untreated, and may have a constant composition and a constant density throughout the second dielectric layer 801.

Figure 9:
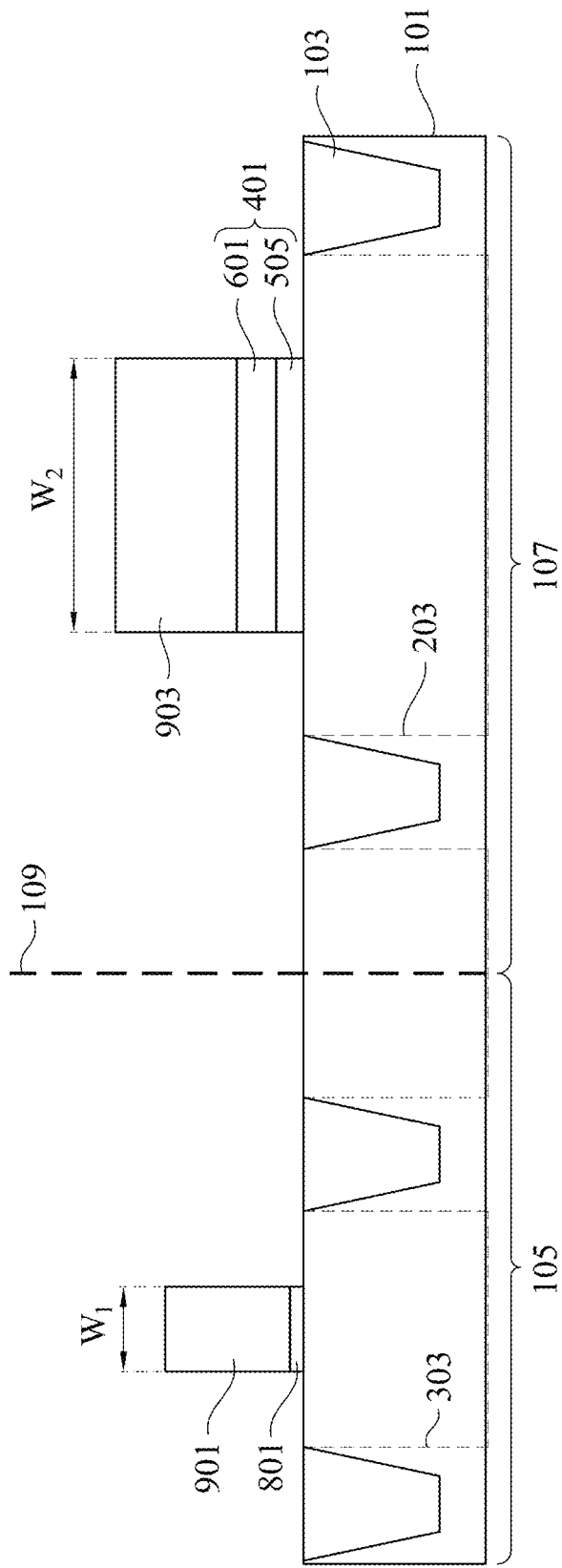
FIG. 9 illustrates formation of a first gate electrode and a second gate electrode, in accordance with some embodiments.

FIG. 9 illustrates a placement and patterning of a first gate electrode 901 (e.g., a logic gate electrode) and a second gate electrode 903 (e.g., an analog gate electrode). The material for the first gate electrode 901 and the second gate electrode 903 is blanket deposited over the first dielectric layer 401 and the second dielectric layer 801. In an embodiment, the first gate electrode 901 and the second gate electrode 903 may include a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In one example, amorphous silicon is deposited and recrystallized to create poly-crystalline silicon (poly-silicon). Additionally, although the first gate electrode 901 and the second gate electrode 903 are illustrated as being a single layer in FIG. 9, the first gate electrode 901 and the second gate electrode 903 may comprise any number of suitable layers.

In an embodiment the material for the first gate electrode 901 and the second gate electrode 903 is first blanket deposited over the first dielectric layer 401 and the second dielectric layer 801. Once in place, the material for the first gate electrode 901 and the second gate electrode 903 is then patterned into the separate gate electrodes and the desired shapes using, e.g., one or more photolithographic masking and etching processes to etch through the material of the first gate electrode 901 and the second gate electrode 903, the first dielectric layer 401, and the second dielectric layer 801. However, any suitable methods may be utilized.

In an embodiment the first gate electrode 901 may be patterned to have a first width W$_1$ (e.g., a first channel length of the logic device formed) of between about 0.05 μm and about 20 μm. Similarly, the second gate electrode 903 may be patterned to have a second width W$_2$ (e.g., a second channel length of the analog device formed) that is larger than the first width W$_1$, such as the second width W$_2$ being between about 0.1 μm and about 20 μm. However, any suitable dimensions may be utilized.

Figure 10:
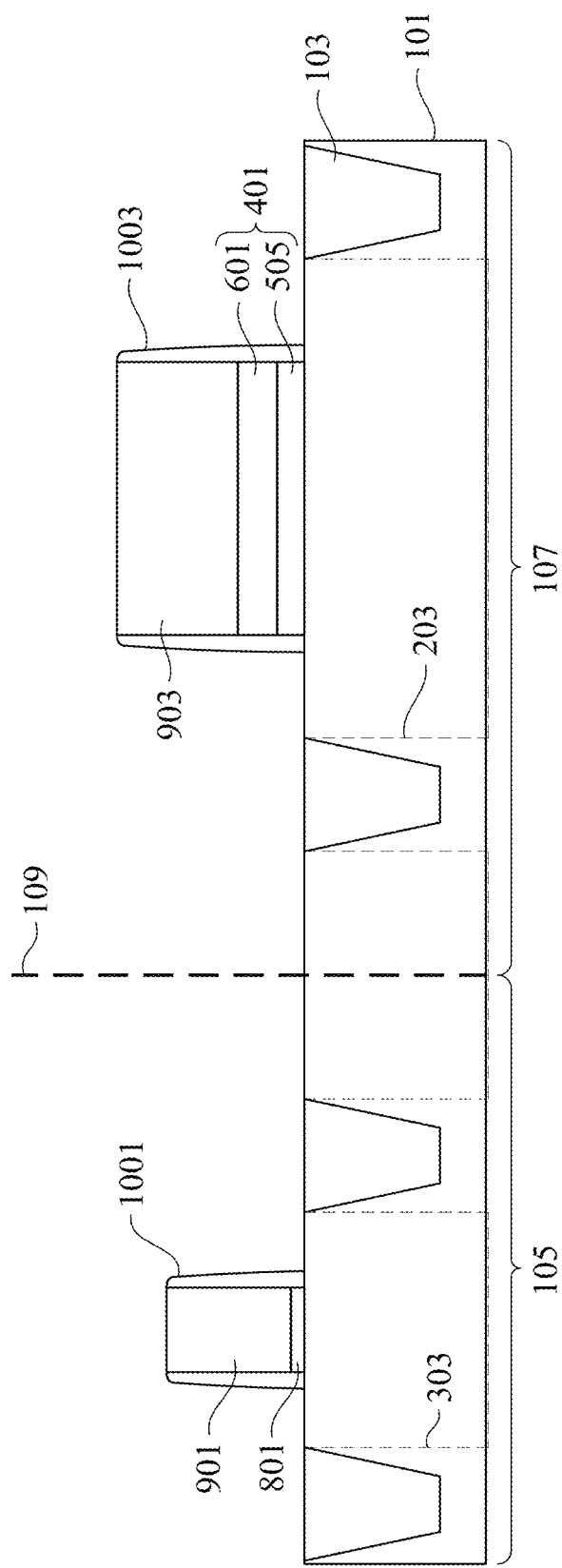
FIG. 10 illustrates formation of spacers, in accordance with some embodiments.

FIG. 10 illustrates the formation of first spacers 1001 on the first gate electrode 901 and second spacers 1003 on the second gate electrode 903. The first spacers 1001 and the second spacers 1003 may be formed by blanket depositing one or more spacer layers (not shown) over the first gate electrode 901 and the second gate electrode 903. The spacer layers may comprise SiN, oxynitride, SiC, SiON, oxide, and the like and may be formed by methods such as chemical vapor deposition (CVD), plasma enhanced CVD (PECVD), sputter, combinations of these, or the like. The spacer layers may be patterned, such as by isotropically or anisotropically etching, thereby removing the spacer layers from the horizontal surfaces of the structure and forming the first spacers 1001 and the second spacers 1003 as illustrated in FIG. 10.

However, as one of ordinary skill in the art will recognize, the process described above and the resulting shape of the first spacers 1001 and the second spacers 1003 as illustrated in FIG. 10 are intended to be merely illustrative and are not intended to limit the embodiments to these descriptions. Rather, any suitable number and combination of spacer layers and shapes may be utilized in order to form the first spacers 1001 and the second spacers 1003 for the first gate electrode 901 and the second gate electrode 903, and any suitable combination of spacers may be utilized.

Figure 11A:
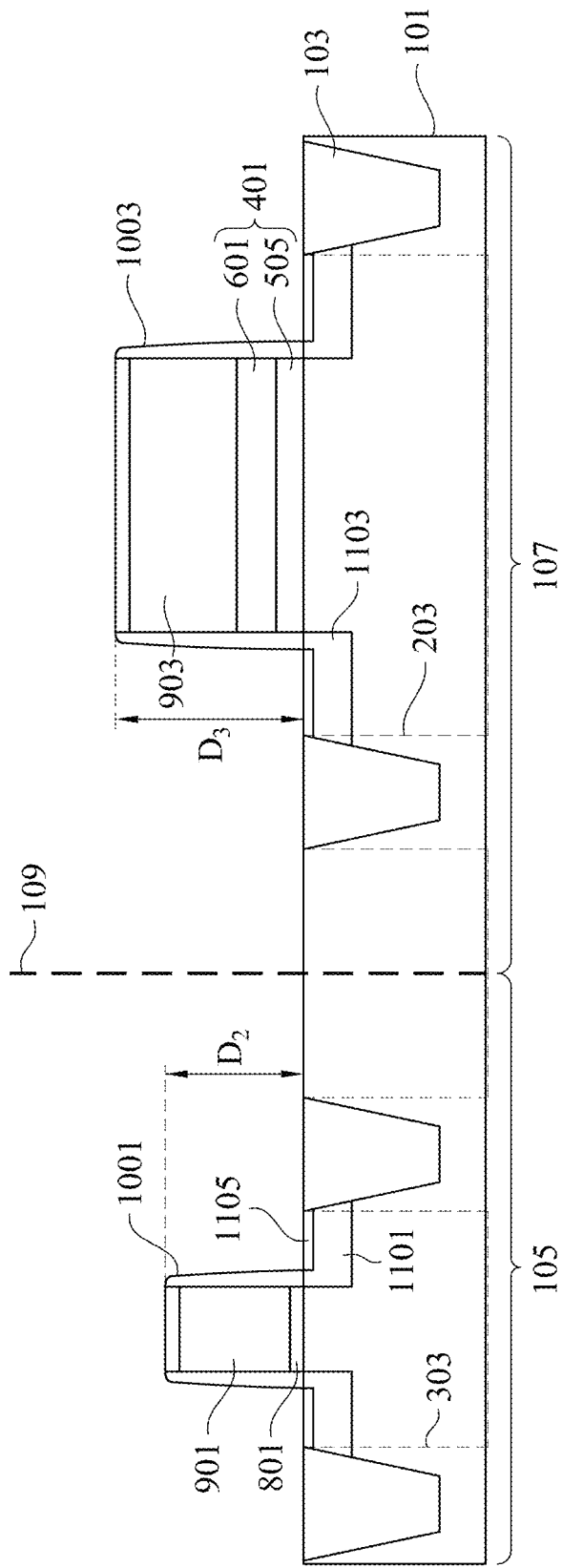
FIG. 11A illustrates formation of source/drain regions and silicide regions, in accordance with some embodiments.

FIG. 11A illustrates formation of first source/drain regions 1101 in the substrate 101 on opposing sides of the first gate electrode 901 and also illustrates formation of second source/drain regions 1103 in the substrate 101 on opposing sides of the second gate electrode 903. In an embodiment in which the second well 303 in the logic region 105 comprises n-type dopants, the first source/drain regions 1101 may be formed by first protecting the analog region 107 (by, e.g., placing and patterning a photoresist over the analog region 107) and then implanting appropriate p-type dopants such as boron, gallium, indium, or the like. In other embodiments in which the second well 303 in the logic region 105 comprises p-type dopants, the first source/drain regions 1101 may be formed by implanting appropriate n-type dopants, such as phosphorous, arsenic, or the like. However, any suitable combination of dopants may be utilized.

Similarly with respect to the second source/drain regions 1103, in an embodiment in which the first well 203 comprises n-type dopants, the second source/drain regions 1103 may be formed by first protecting the logic region 105 (by, e.g., placing and patterning a photoresist over the device region 105) and then by implanting appropriate p-type dopants such as boron, gallium, indium, or the like. In other embodiments, in which the first well 203 in the analog region 107 comprises p-type dopants, the second source/drain regions 1103 may be formed by implanting appropriate n-type dopants, such as phosphorous, arsenic, or the like. However, any suitable combination of dopants may be utilized.

While the first source/drain regions 1101 may be implanted using the first gate electrode 901 and the first spacers 1001 as masks, and the second source/drain regions 1103 may be implanted using the second gate electrode 903 and the second spacers 1003 as masks, it should be noted that one of ordinary skill in the art will realize that many other processes, steps, or the like may be used to form these first source/drain regions 1101 and the second source/drain regions 1103. For example, one of ordinary skill in the art will realize that a plurality of implants may be performed using various combinations of spacers and liners to form the first source/drain regions 1101 and the second source/drain regions 1103 to have a specific shape or characteristic suitable for a particular purpose. Any of these processes may be used to form the first source/drain regions 1101 and the second source/drain regions 1103, and the above description is not meant to limit the embodiments to the steps presented above.

FIG. 11A additionally illustrates formation of silicide regions 1105 over the first source/drain regions 1101, the second source/drain regions 1103, the first gate electrode 901, and the second gate electrode 903. In an embodiment the silicide regions 1105 comprise a nickel silicide, although any other suitable metal silicide, such as titanium silicide, cobalt silicide, palladium silicide, platinum silicide, erbium silicide, and the like, can also be used. The silicide regions 1105 may be formed with an initial blanket deposition of an appropriate metal layer, followed by an annealing step in which the metal reacts with the underlying material of the substrate (e.g., silicon). Unreacted metal is then removed, such as with a selective etch process. The thickness of the silicide regions 1105 may be between about 3 nm and about 50 nm.

Additionally, once the silicide regions 1105 have been formed, a top surface of the first gate electrode 901 may extend less from the substrate 101 than the second gate electrode 903. For example, the first gate electrode 901 may extend a second distance $D_2$ from the substrate 101 of between about 25 nm and about 250 nm, while the second gate electrode 903 may extend a third distance $D_3$ of between about 25 nm and about 250 nm. However, any suitable distances may be utilized.

Figure 11B:
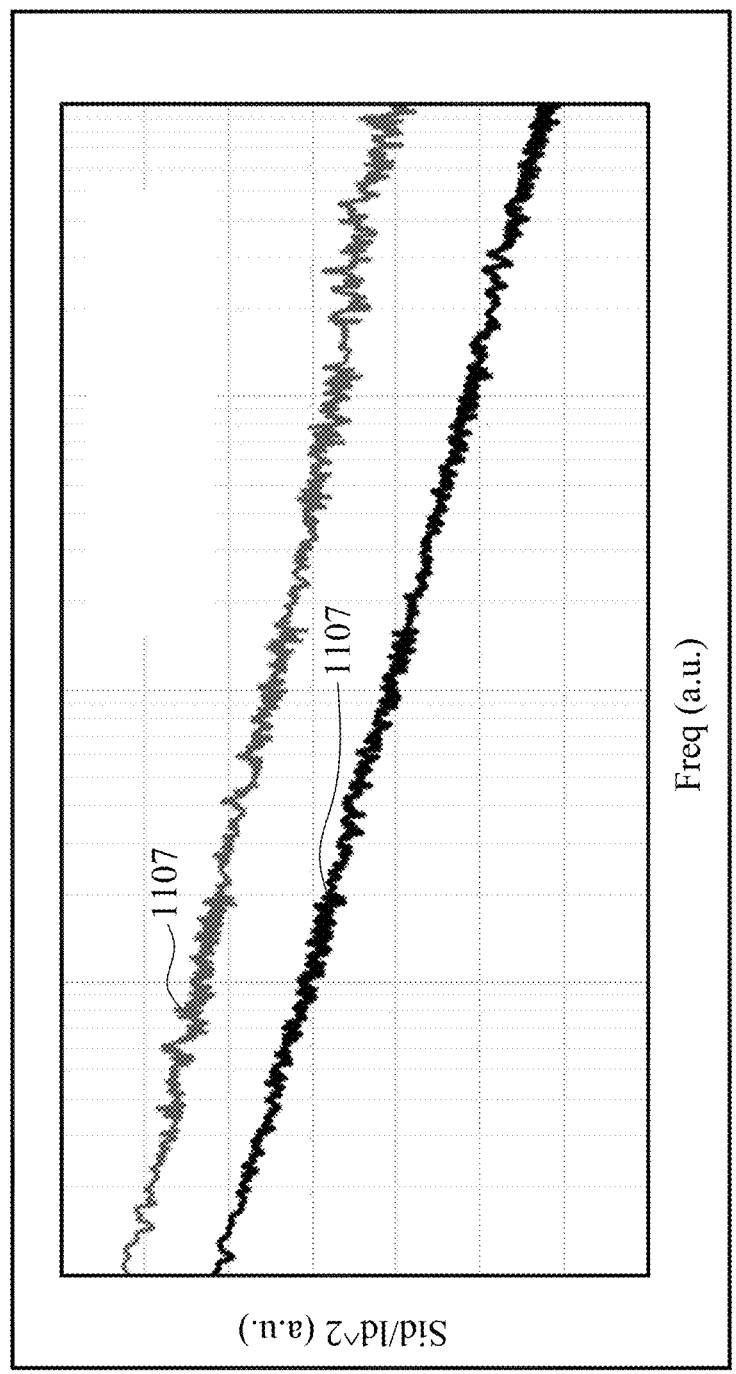
FIG. 11B illustrates a chart which illustrates normalized current noise spectral densities, in accordance with some embodiments.

FIG. 11B illustrates improvements that can be achieved by utilizing the embodiments described herein. As illustrated, normalized current noise spectral densities ($S_{id}/Id^2$) are measured along the y-axis, while frequencies are plotted along the x-axis. As can be seen, when compared to devices that do not utilize the embodiments described herein (represented in FIG. 11B by the data line labeled 1107), devices that do utilize the embodiments described herein (represented in FIG. 11B by the data line labeled 1109) can see a significant decrease. In some cases the significant decrease can result in an 8× or greater improvement.

In particular, by improving the quality of first dielectric layer 401 of the analog devices formed within the analog region 107, the flicker noise performance of these MOSFETs (e.g., caused by trapping and detrapping within the first dielectric layer 401) can be reduced without the use of an additional mask. As such, a low cost process that is fully compatible with the remaining CMOS processes may be utilized to lower the flicker noise, thereby also lower the signal to noise ratio of the analog devices. As such, a better overall performance of the devices may be achieved, especially in devices which are used to transfer digital data (e.g., from a CPU) to an analog signal (e.g., to a color display for an LCD panel).

Figure 12:
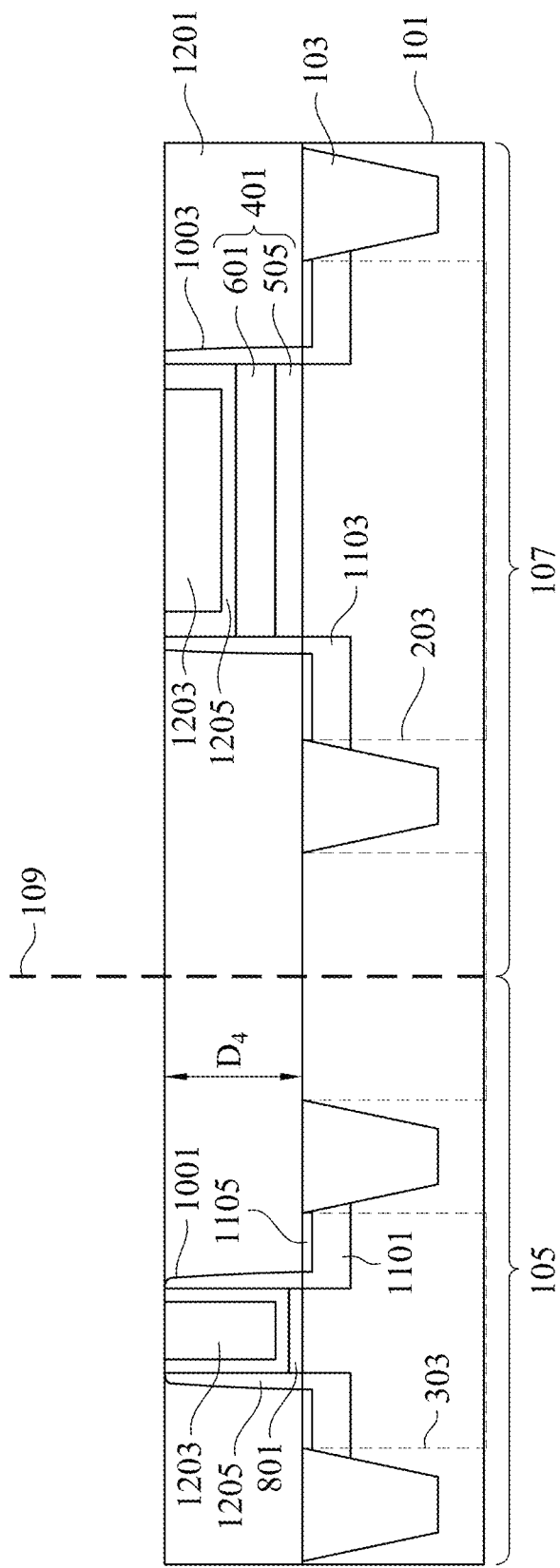
FIG. 12 illustrates a gate-last process, in accordance with some embodiments.

FIG. 12 illustrates another embodiment which may continue from the structure described above with respect to FIG. 11A in a "gate-last" process (although the "gate-first process" described with respect to FIGS. 1-11B may also be used without additional processing). In this embodiment, the material of the first gate electrode 901 and the second gate electrode 903, instead of being the final material to be used, is instead a dummy material, such as polysilicon, that is subsequently removed. In particular, once the silicide regions 1105 have been formed, a first interlayer dielectric (ILD) 1201 is deposited over the structure illustrated in FIG. 11A. The first ILD 1201 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL—not separately illustrated in FIG. 12) is disposed between the first ILD 1201 and underlying structures. The CESL may comprise a dielectric material, such as, silicon nitride, silicon oxide, silicon oxynitride, or the like, having a lower etch rate than the material of the overlying first ILD 1201.

Once the first ILD 1201 has been formed, the first ILD 1201 is planarized in order to expose the first gate electrode 901 and the second gate electrode 903. In an embodiment the planarization process may be a process such as chemical mechanical polishing, grinding, combinations of these, or the like. After the planarization process, top surfaces of the first gate electrode 901 and the second gate electrode 903 are exposed through the first ILD 1201.

Once the first gate electrode 901 and the second gate electrode 903 are exposed, the first gate electrode 901 and the second gate electrode 903 are removed in one or more etching step(s), so that recesses are formed. In some embodiments, the first gate electrode 901 and the second gate electrode 903 are removed by an anisotropic dry etch process. For example, the etching process may include a dry etch process using reaction gas(es) that selectively etch the first gate electrode 901 and the second gate electrode 903 with little or no etching of the first ILD 1201 or the first spacers 1001 and second spacers 1003. During the removal, the first dielectric layer 401 and the second dielectric layer 801 may be used as an etch stop layer when the first gate electrode 901 and the second gate electrode 903 are etched.

Once the recesses have been formed, gate dielectric layers 1205 and gate electrodes 1203 are formed for replacement gates. Gate dielectric layers 1205 are one or more layers deposited in the recesses, such as on the top surfaces of the first dielectric layer 401 and the second dielectric layer 801 and on sidewalls of the first spacers 1001 and the second spacers 1003. The gate dielectric layers 1205 may also be formed on the top surface of the first ILD 1201. In some embodiments, the gate dielectric layers 1205 comprise one or more dielectric layers, such as one or more layers of silicon oxide, silicon nitride, metal oxide, metal silicate, or the like. For example, in some embodiments, the gate dielectric layers 1205 include a high-k dielectric material, such as a metal oxide or a silicate of hafnium, aluminum, zirconium, lanthanum, manganese, barium, titanium, lead, and combinations thereof. The gate dielectric layers 1205 may include a dielectric layer having a k value greater than about 7.0. The formation methods of the gate dielectric layers 1205 may include Molecular-Beam Deposition (MBD), ALD, PECVD, and the like.

The gate electrodes 1203 are deposited over the gate dielectric layers 1205, respectively, and fill the remaining portions of the recesses. The gate electrodes 1203 may include a metal-containing material such as titanium nitride, titanium oxide, tantalum nitride, tantalum carbide, cobalt, ruthenium, aluminum, tungsten, combinations thereof, or multi-layers thereof. Additionally, although a single layer gate electrode 1203 is illustrated, the gate electrode 1203 may comprise any number of liner layers, any number of work function tuning layers, and a fill material. After the filling of the recesses, a planarization process, such as a CMP, may be performed to remove the excess portions of the gate dielectric layers 1205 and the material of the gate electrodes 1203, which excess portions are over the top surface of the first ILD 1201. As such, the gate dielectric layers 1205 may extends along multiple sides of the gate electrodes 1203, and top surfaces of the gate electrodes 1203 located in both the analog region 107 and the logic region 105 are located an equal distance away from the substrate 101, such as by being located a fourth distance $D_4$ of between about 20 nm and about 200 nm. The remaining portions of material of the gate electrodes 1203 and the gate dielectric layers 1205 thus form replacement gates. The gate electrodes 1203 and the gate dielectric layers 1205 may be collectively referred to as a "gate stack."

The formation of the gate dielectric layers 1205 in the logic region 105 and the analog region 107 may occur simultaneously such that the gate dielectric layers 1205 in each region are formed from the same materials, and the formation of the gate electrodes 1203 may occur simultaneously such that the gate electrodes 1203 in each region are formed from the same materials. In other embodiments, the gate dielectric layers 1205 in each region may be formed by distinct processes, such that the gate dielectric layers 1205 may be different materials, and/or the gate electrodes 1203 in each region may be formed by distinct processes, such that the gate electrodes 1203 may be different materials. Various masking steps may be used to mask and expose appropriate regions when using distinct processes.

Figure 13:
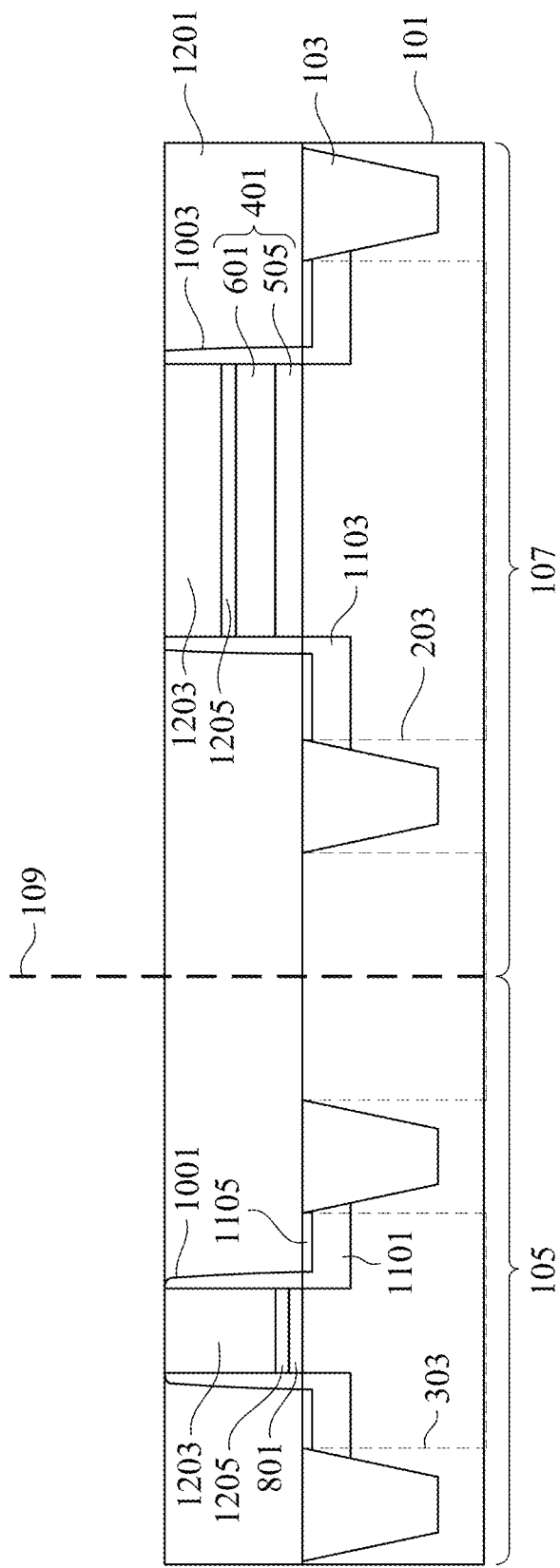
FIG. 13 illustrates another gate-last process with a different order of process steps, in accordance with some embodiments.

FIG. 13 illustrates another "gate-last" embodiment in which the gate dielectric layers 1205, instead of being formed after the formation of the first ILD 1201, are formed prior to formation of the first ILD 1201. In this embodiment, prior to deposition of the material of the first gate electrode 901 and the second gate electrode 903, the material of the gate dielectric layers 1205 is deposited over the first dielectric layer 401 and the second dielectric layer 801. The gate dielectric layers 1205 in this embodiment may be deposited as described above with respect to FIG. 12.

Once deposited, the first gate electrode 901 and the second gate electrode 903 are formed and patterned, whereby the patterning of the first gate electrode 901 and the second gate electrode 903 is also utilized to pattern the gate dielectric layers 1205. As such, the gate dielectric layers 1205 are patterned to have a single planar section that is located directly over the first dielectric layer 401 and the second dielectric layer 801.

Once the first gate electrode 901 and the second gate electrode 903 are formed, the first ILD 1201 is deposited and planarized, and the first gate electrode 901 and the second gate electrode 903 are removed. Once removed, the gate electrodes 1203 (but not the gate dielectric layers 1205 because this has already been formed) are deposited to replace the first gate electrode 901 and the second gate electrode 903. As such, the gate electrodes 1203 are deposited in physical contact with the first spacers 1001 (in the logic region 105) and the second spacers (in the analog region 107). In an embodiment the gate electrodes 1203 are deposited as described above with respect to FIG. 12. However, any suitable methods and materials may be utilized.

By treating the first dielectric layer 401 to form the recovered region 601, the trapping and detrapping that normally occurs at sufficient frequencies in an analog devices can be reduced. By reducing the trapping and detrapping, the overall flicker noise of the analog device can be reduced, thereby improving the overall performance of the device. These improvements may be achieved using no additional masks, at a low cost, and with processes that are fully compatible with the remainder of the processes used to form CMOS devices.

Additionally, while the embodiments presented herein are described as embodiments for use in planar devices, the ideas are not intended to be limited to planar devices. Rather, the ideas may be implemented in a wide variety of devices, including fin field effect transistors (finFETs), nanostructure devices, combinations of these, or the like. All such embodiments are fully intended to be included within the scope of the embodiments.

In accordance with an embodiment, a method of manufacturing a semiconductor device, the method including: depositing a first dielectric layer over a logic region and an analog region of a semiconductor substrate; treating the first dielectric layer to form a recovered layer; after the treating the first dielectric layer, removing a first portion of the recovered layer from the logic region; forming a second dielectric layer in the logic region; and depositing a gate electrode material over a remainder of the recovered layer and the second dielectric layer. In an embodiment the treating the first dielectric layer further includes: exposing the first dielectric layer to a plasma to form a treated region; and annealing the treated region. In an embodiment the plasma comprises oxygen, nitrogen, fluorine, or chlorine. In an embodiment the treating the first dielectric layer further comprises annealing the first dielectric layer. In an embodiment the annealing is performed in an oxygen environment. In an embodiment the recovered layer has a first thickness, the first dielectric layer has a second thickness, and the first thickness is between 5% and 30% of the second thickness. In an embodiment the method further includes patterning the gate electrode material into a first gate electrode over the recovered layer and a second gate electrode over the second dielectric layer, the first gate electrode having a larger width than the second gate electrode.

In accordance with another embodiment, a method of manufacturing a semiconductor device, the method including: blanket depositing a first dielectric layer over a first region of a substrate and a second region of the substrate; exposing a top surface of the first dielectric layer to a first plasma to form a treated region within the first dielectric layer over a non-treated region of the first dielectric layer; recovering the treated region with a first annealing process to form a recovered region over the non-treated region; removing the first dielectric layer from the first region; forming a second dielectric layer in the first region; forming a first gate electrode over the first dielectric layer in the second region; and forming a second gate electrode over the second dielectric layer in the first region. In an embodiment the method further includes replacing the first gate electrode and the second gate electrode. In an embodiment the first plasma comprises an oxygen plasma. In an embodiment the first plasma comprises a chlorine plasma. In an embodiment the first plasma comprises a nitrogen plasma. In an embodiment a first thickness of the recovered region is less than 30% of a second thickness of the first dielectric layer. In an embodiment the first region is a logic region and the second region is an analog region.

In yet another embodiment, a semiconductor device includes: a logic device located in a logic region of a substrate, the logic device including: a first dielectric layer having a constant density throughout the first dielectric layer; and a first gate electrode overlying the first dielectric layer; and an analog device located in an analog region of the substrate, the analog device including: a second dielectric layer, the second dielectric layer comprising a recovered region and a non-treated region, the recovered region having a different density than the non-treated region; and a second gate electrode overlying the second dielectric layer. In an embodiment a first top surface of the first gate electrode is a first distance away from the substrate and wherein a second top surface of the second gate electrode is located a second distance away from the substrate, the second distance being greater than the first distance. In an embodiment a first top surface of the first gate electrode is a first distance away from the substrate and wherein a second top surface of the second gate electrode is located the first distance away from the substrate. In an embodiment the semiconductor device further includes a first high-k dielectric layer between the second dielectric layer and the second gate electrode, wherein the first high-k dielectric layer extends along multiple sides of the second gate electrode. In an embodiment the semiconductor device further includes a first high-k dielectric layer between the second dielectric layer and the second gate electrode, wherein the second gate electrode is in physical contact with a spacer. In an embodiment the second gate electrode has a width that is larger than the first gate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    depositing a first dielectric layer over a logic region and an analog region of a semiconductor substrate;
    treating the first dielectric layer to form a recovered layer and a non-treated layer, the non-treated layer being located between the recovered layer and the semiconductor substrate;
    after the treating the first dielectric layer, removing a first portion of the recovered layer from the logic region while the non-treated layer is present;
    forming a second dielectric layer in the logic region; and
    depositing a gate electrode material over a remainder of the recovered layer and the second dielectric layer.

2. The method of claim 1, wherein the treating the first dielectric layer further comprises:
    exposing the first dielectric layer to a plasma to form a treated region; and
    annealing the treated region.

3. The method of claim 2, wherein the plasma comprises oxygen, nitrogen, fluorine, or chlorine.

4. The method of claim 1, wherein the treating the first dielectric layer further comprises annealing the first dielectric layer.

5. The method of claim 4, wherein the annealing is performed in an oxygen environment.

6. The method of claim 1, wherein the recovered layer has a first thickness, the first dielectric layer has a second thickness, and the first thickness is between 5% and 30% of the second thickness.

7. The method of claim 1, further comprising patterning the gate electrode material into a first gate electrode over the recovered layer and a second gate electrode over the second dielectric layer, the first gate electrode having a larger width than the second gate electrode.

8. A method of manufacturing a semiconductor device, the method comprising:
    blanket depositing a first dielectric layer over a first region of a substrate and a second region of the substrate;
    exposing a top surface of the first dielectric layer to a first plasma to form a treated region within the first dielectric layer over a non-treated region of the first dielectric layer;
    recovering the treated region with a first annealing process to form a recovered region over the non-treated region, wherein after the recovering the treated region the non-treated region is located between the treated region and the substrate;
    removing the first dielectric layer from the first region;
    forming a second dielectric layer in the first region;
    forming a first gate electrode over the first dielectric layer in the second region; and
    forming a second gate electrode over the second dielectric layer in the first region.

9. The method of claim 8, further comprising replacing the first gate electrode and the second gate electrode.

10. The method of claim 8, wherein the first plasma comprises an oxygen plasma.

11. The method of claim 8, wherein the first plasma comprises a chlorine plasma.

12. The method of claim 8, wherein the first plasma comprises a nitrogen plasma.

13. The method of claim 8, wherein a first thickness of the recovered region is less than 30% of a second thickness of the first dielectric layer.

14. The method of claim 8, wherein the first region is a logic region and the second region is an analog region.

15. A method of manufacturing a semiconductor device, the method comprising:
    forming a logic device located in a logic region of a substrate, the forming the logic device comprising:
        forming a first dielectric layer having a constant density throughout the first dielectric layer; and
        forming a first gate electrode overlying the first dielectric layer; and
    forming an analog device located in an analog region of the substrate, the forming the analog device comprising:
        forming a second dielectric layer, the second dielectric layer comprising a recovered region and a non-treated region, the recovered region having a different density than the non-treated region; and
        forming a second gate electrode overlying the second dielectric layer.

16. The method of claim 15, wherein after the forming the analog device a first top surface of the first gate electrode is a first distance away from the substrate and wherein a second top surface of the second gate electrode is located a second distance away from the substrate, the second distance being greater than the first distance.

17. The method of claim 15, wherein after the forming the analog device a first top surface of the first gate electrode is a first distance away from the substrate and wherein a second top surface of the second gate electrode is located the first distance away from the substrate.

18. The method of claim 15, further comprising forming a first high-k dielectric layer after the forming the second dielectric layer and prior to the forming the second gate electrode, wherein the first high-k dielectric layer extends along multiple sides of the second gate electrode.

19. The method of claim 15, further comprising forming a first high-k dielectric layer after the forming the second dielectric layer and prior to the forming the second gate electrode, wherein the second gate electrode is in physical contact with a spacer.

20. The method of claim 15, wherein after the forming the analog device the second gate electrode has a width that is larger than the first gate electrode.

\* \* \* \* \*